(12) United States Patent
Lee et al.

(10) Patent No.: US 12,406,830 B2
(45) Date of Patent: Sep. 2, 2025

(54) APPARATUS FOR TREATING SUBSTRATE AND METHOD FOR TREATING SUBSTRATE

(71) Applicant: SEMES CO., LTD., Chungcheongnam-do (KR)

(72) Inventors: Sun Ryum Lee, Chungcheongnam-do (KR); Loung Sue Chang, Chungcheongnam-do (KR); Jung Yoon Yang, Chungcheongnam-do (KR); In Seong Lim, Gyeonggi-do (KR); Seung Hoon Jeon, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 730 days.

(21) Appl. No.: 17/547,303

(22) Filed: Dec. 10, 2021

(65) Prior Publication Data

US 2022/0199364 A1 Jun. 23, 2022

(30) Foreign Application Priority Data

Dec. 21, 2020 (KR) .................. 10-2020-0180320

(51) Int. Cl.
H01J 37/32 (2006.01)

(52) U.S. Cl.
CPC ...... *H01J 37/3222* (2013.01); *H01J 37/3244* (2013.01)

(58) Field of Classification Search
CPC .............. H01J 37/3222; H01J 37/3244
USPC .................................. 118/723 AN
See application file for complete search history.

(56) References Cited

U.S. PATENT DOCUMENTS

| 2008/0142159 A1* | 6/2008 | Sasaki ............... H01J 37/32495 257/E21.285 |
| 2009/0029564 A1 | 1/2009 | Yamashita |
| 2009/0074632 A1* | 3/2009 | Ishibashi ........... H01J 37/32192 422/186.04 |

(Continued)

FOREIGN PATENT DOCUMENTS

| CN | 101002509 A | 7/2007 |
| CN | 101133688 A | 2/2008 |

(Continued)

OTHER PUBLICATIONS

Office Action dated Feb. 9, 2023 issued by the Korean Patent Office in corresponding KR Patent Application No. 10-2020-0180320, pp. 1-5.

(Continued)

*Primary Examiner* — Charlee J. C. Bennett
(74) *Attorney, Agent, or Firm* — Carter, DeLuca & Farrell LLP

(57) ABSTRACT

Disclosed is a microwave application unit for applying a microwave to generate plasma. The microwave application unit includes an antenna plate disposed on the support unit and having a plurality of slots; a power supply configured to apply a microwave to the antenna plate; a dielectric plate disposed above the antenna plate to face the antenna plate; an upper plate disposed above the dielectric plate; and a transmissive plate provided below the antenna plate and configured to transmit the microwave to the processing space, wherein an adjustment groove configured to adjust an electric field is formed on an lower surface of the upper plate.

17 Claims, 13 Drawing Sheets

(56) References Cited

U.S. PATENT DOCUMENTS

2015/0232993 A1\* 8/2015 Iwao ................. H01J 37/32192
  118/723 AN
2019/0180989 A1\* 6/2019 Nogami ............ H01J 37/32807

FOREIGN PATENT DOCUMENTS

| CN | 101599408 A | 12/2009 |
|----|---|---|
| CN | 101803472 A | 8/2010 |
| JP | 2010232493 A | 10/2010 |
| JP | 2016225047 A | 12/2016 |
| KR | 10-0485235 A | 4/2005 |
| KR | 10-0824813 A | 4/2008 |
| KR | 10-2011-0128888 A | 11/2011 |
| KR | 10-2013-0035838 A | 4/2013 |

OTHER PUBLICATIONS

Chinese Office Action issued by the China National Intellectual Property Administration on Mar. 31, 2025 in corresponding CN Patent Application No. 202111572170.3, with English translation.

\* cited by examiner

APPARATUS FOR TREATING SUBSTRATE AND METHOD FOR TREATING SUBSTRATE

CROSS-REFERENCE TO RELATED APPLICATIONS

This application claims priority to and the benefit of the Korean Patent Application No. 10-2020-0180320 filed in the Korean Intellectual Property Office on Dec. 21, 2020, the entire contents of which are incorporated herein by reference.

TECHNICAL FIELD

The present invention relates to an apparatus and a method for treating a substrate, and more particularly, to an apparatus and a method for treating a substrate using plasma.

BACKGROUND ART

Plasma is generated by a very high temperature, a strong electric field, or RF electromagnetic fields, and means an ionized gas condition consisting of ions, electrons, radicals and the like. In a semiconductor device manufacturing process, various processes are performed using plasma. FIG. 1 is a cross-sectional view illustrating a general substrate processing apparatus for processing a substrate using a microwave. Referring to FIG. 1, a substrate W is supported to a support unit 20 disposed in a processing space 12, and the substrate is processed by generating plasma from processing gas by using a microwave in the processing space 12. An antenna plate 40 having a slot 42 is provided in an upper region of the substrate W. A dielectric plate 50 is disposed on the antenna plate 40, and a transmissive plate 60 is disposed below the antenna plate 40. When the microwave is applied to the antenna plate 40, the microwave is propagated along a radial direction of the antenna plate 40 and then transmitted to the processing space 12 through the slot 42 and the transmissive plate 60.

When using a substrate processing apparatus 1 having the structure of FIG. 1, an electric field is concentrated in a region facing an edge region of the antenna plate 40 in the processing space 12, so that the plasma density is relatively higher than that of other regions. Further, in the antenna plate 40 of the processing space 12, the electric field is concentrated in a region facing the region in which the slot 42 is formed, so that plasma density is relatively higher than other regions. In the processing space 12, the non-uniformity of the plasma density deteriorates the process uniformity when the substrate is processed with the plasma. For example, as illustrated in FIG. 2, in the processing space 12, when an edge region A is provided to have higher plasma density than a central region B, an edge region W1 of the substrate has a higher etching rate than a central region W2 of the substrate when performing the etching process. Further, when performing an annealing process for the substrate using the plasma, the annealing degree between the edge region W1 and the central region W2 of the substrate is different from each other.

In order to solve the above problems, the plasma density in the processing space is adjusted by changing a shape of the slot formed in the antenna plate, a position of the slot, and a distribution of the slots, but there is a structural limitation in the change of the slot. Further, the plasma density is adjusted by variously changing the shape of the transmissive plate disposed below the antenna plate, but there is a problem such that particles occur according to the shape of the transmissive plate.

SUMMARY OF THE INVENTION

An object of the present invention is to provide an apparatus for processing a substrate and a method for processing a substrate capable of improving the substrate processing efficiency.

Further, an object of the present invention is to provide an apparatus for processing a substrate and a method for processing a substrate capable of improving the uniformity of plasma density in the entire region of a processing space provided by the substrate.

Further, an object of the present invention is to provide an apparatus for processing a substrate and a method for processing a substrate to which a new factor for adjusting the plasma density is applied in a processing space when processing the substrate using plasma.

Other objects of the present invention are not limited to the objects described above, and other objects, which are not mentioned above, will be apparent to those skilled in the art from the following description.

An exemplary embodiment of the present invention provides an apparatus for treating a substrate. The apparatus for treating the substrate may include a process chamber configured to have a processing space therein; a support unit configured to support the substrate in the process chamber; a gas supply unit configured to supply processing gas to the processing space; and a microwave application unit configured to generate plasma from the processing gas supplied to the processing space. The microwave application unit may include an antenna plate disposed on the support unit and having a plurality of slots; a power supply configured to apply a microwave to the antenna plate; a dielectric plate disposed above the antenna plate to face the antenna plate; an upper plate disposed above the dielectric plate; and a transmissive plate provided below the antenna plate and configured to transmit the microwave to the processing space. An adjustment groove configured to adjust an electric field may be formed on an lower surface of the upper plate.

According to the exemplary embodiment, the adjustment groove may be provided in a region facing the slot formed in the antenna plate.

According to the exemplary embodiment, the adjustment groove may be provided in a ring shape surrounded a center of the antenna plate when viewed from the top.

According to the exemplary embodiment, the adjustment groove may be provided in a region facing an edge region of the antenna plate.

According to the exemplary embodiment, the slots may be arranged to form one ring or a plurality rings to surround the center of the antenna plate, and the adjustment grooves may be provided in regions overlapping with the slots when viewed from the top, respectively.

According to the exemplary embodiment, the slots may be arranged to form one ring or a plurality rings to surround the center of the antenna plate, and the adjustment grooves may be provided so that depths thereof are different from each other according to a distance from the center of the antenna plate.

According to the exemplary embodiment, the adjustment grooves may be provided so that the depths thereof are increased as being far away from the center of the antenna plate.

According to the exemplary embodiment, the upper plate may include a base plate having a through hole; and an adjustment plate disposed in the through hole and provided to be movable in a vertical direction to the base plate, wherein a lower region of the adjustment plate among the through hole is provided as the adjustment groove, and the depth of the adjustment groove is provided to be changeable along the movement in the vertical direction of the adjustment plate.

According to the exemplary embodiment, the upper plate may further include a driver configured to drive the adjustment plate in a vertical direction.

According to the exemplary embodiment, the adjustment plate may be screwed with the base plate.

According to the exemplary embodiment, the upper plate and the dielectric plate may be disposed in contact with each other.

An exemplary embodiment of the present invention provides an apparatus for treating a substrate. The apparatus for treating the substrate includes a process chamber configured to have a processing space therein; a support unit configured to support the substrate in the process chamber; an antenna plate disposed above the support unit and having a plurality of slots penetrated in a vertical direction; a power supply configured to apply a microwave to the antenna plate; a dielectric plate disposed above the antenna plate to face the antenna plate; an upper plate disposed above the dielectric plate and including a cooling member to cool the dielectric plate; a transmissive plate provided below the antenna plate and configured to transmit the microwave to the processing space; and a gas supply unit configured to supply processing gas to the processing space, wherein a ring-shaped adjustment groove configured to adjust an electric field is formed on an lower surface of the upper plate.

According to the exemplary embodiment, the antenna plate may include a first region and a second region which are provided with the plurality of slots, respectively, and have ring shapes which are concentric with the center of the antenna plate, the first region may be a region which is farther away from the center of the antenna plate than the second region, and the ring-shaped adjustment groove may include a first groove provided in a region facing the first region.

According to the exemplary embodiment, the ring-shaped adjustment groove may further include a second groove provided in a region facing the second region.

According to the exemplary embodiment, a depth of the first groove may be provided larger than a depth of the second groove.

According to the exemplary embodiment, the adjustment groove may be provided in a region facing the slot.

According to the exemplary embodiment, the upper plate may include a base plate provided with a through hole; and an adjustment plate disposed in the through hole and provided to be movable in a vertical direction to the base plate, wherein the depth of the adjustment groove may be provided to be changeable along the movement in the vertical direction of the adjustment plate.

An exemplary embodiment of the present invention provides a method for treating a substrate. The method for processing the substrate includes disposing an upper plate, a dielectric plate, an antenna plate formed with a plurality of slots, and a transmissive plate sequentially in a direction from the top to the bottom, transmitting a microwave applied to the antenna plate to a processing space below the transmissive plate through the transmissive plate, and generating plasma from processing gas supplied to the processing space to treat the substrate in the processing space, wherein adjustment grooves are formed on the lower surface of the upper plate to adjust an electric field provided to the processing space by the microwave.

According to the exemplary embodiment, the processing gas may be gas containing hydrogen, and the treating of the substrate may include an annealing process.

According to the exemplary embodiment, the adjustment groove may be formed in the region facing the slot to reduce the electric field below the slot.

According to the present invention, it is possible to improve the substrate processing efficiency when processing the substrate using the plasma.

According to the present invention, it is possible to improve the uniformity of plasma density in the entire region of the processing space disposed in the substrate.

According to the present invention, it is possible to precisely adjust the plasma density by providing an adjustment groove below an upper plate as a factor for adjusting the plasma density.

The effect of the present invention is not limited to the foregoing effects, and non-mentioned effects will be clearly understood by those skilled in the art from the present specification and the accompanying drawings.

DETAILED DESCRIPTION

Figure 1:
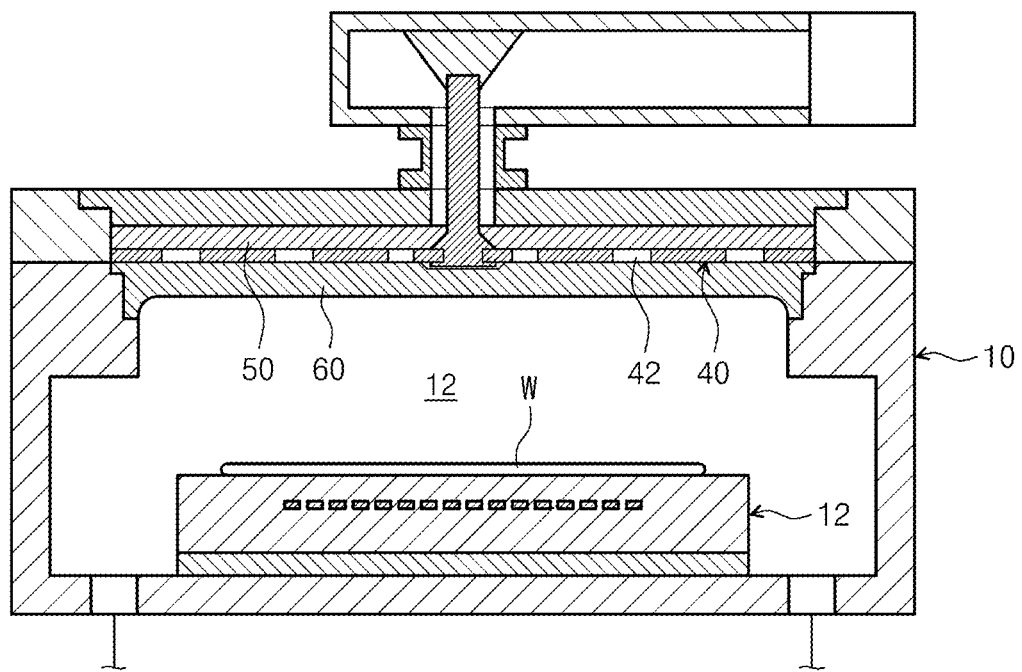
FIG. 1 is a cross-sectional view schematically illustrating a general substrate processing apparatus.
Figure 2:
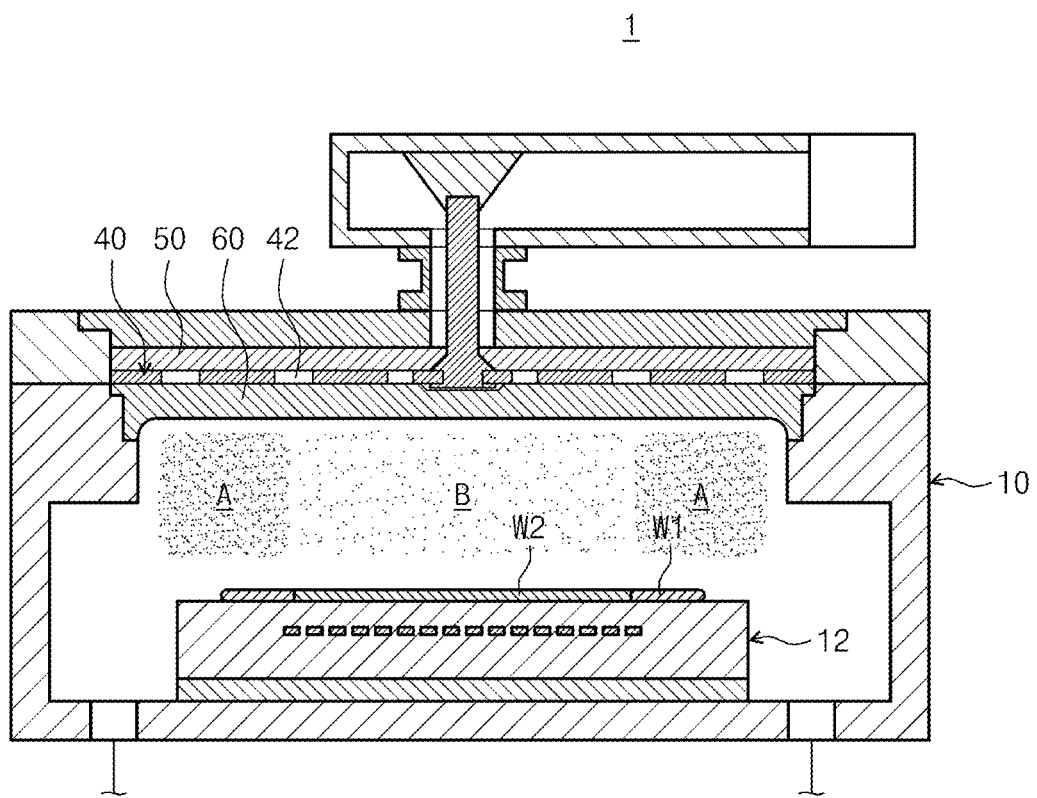
FIG. 2 is a diagram for describing plasma density for each region in a processing space in the apparatus of FIG. 1.

Hereinafter, an exemplary embodiment of the present invention will be described in more detail with reference to the accompanying drawings. The exemplary embodiment of the present invention can be modified in various forms, and it should not be construed that the scope of the present invention is limited to exemplary embodiments described below. The exemplary embodiments will be provided to more completely describe the present invention to those skilled in the art. Therefore, shapes, and the like of components in the drawings will be exaggerated to emphasize a more clear description.

An apparatus of an exemplary embodiment may be used to perform an annealing process using hydrogen plasma with respect to a circular semiconductor substrate. However, the technical idea of the present invention is not limited thereto, and may be applied to various types of processes for processing the substrate using plasma. For example, the technical idea of the present invention can be applied to an etching process of removing a thin film on a substrate W using plasma or a deposition process of depositing the thin film on the substrate.

Hereinafter, an exemplary embodiment of the present invention will be described with reference to FIGS. 3 to 18.

Figure 3:
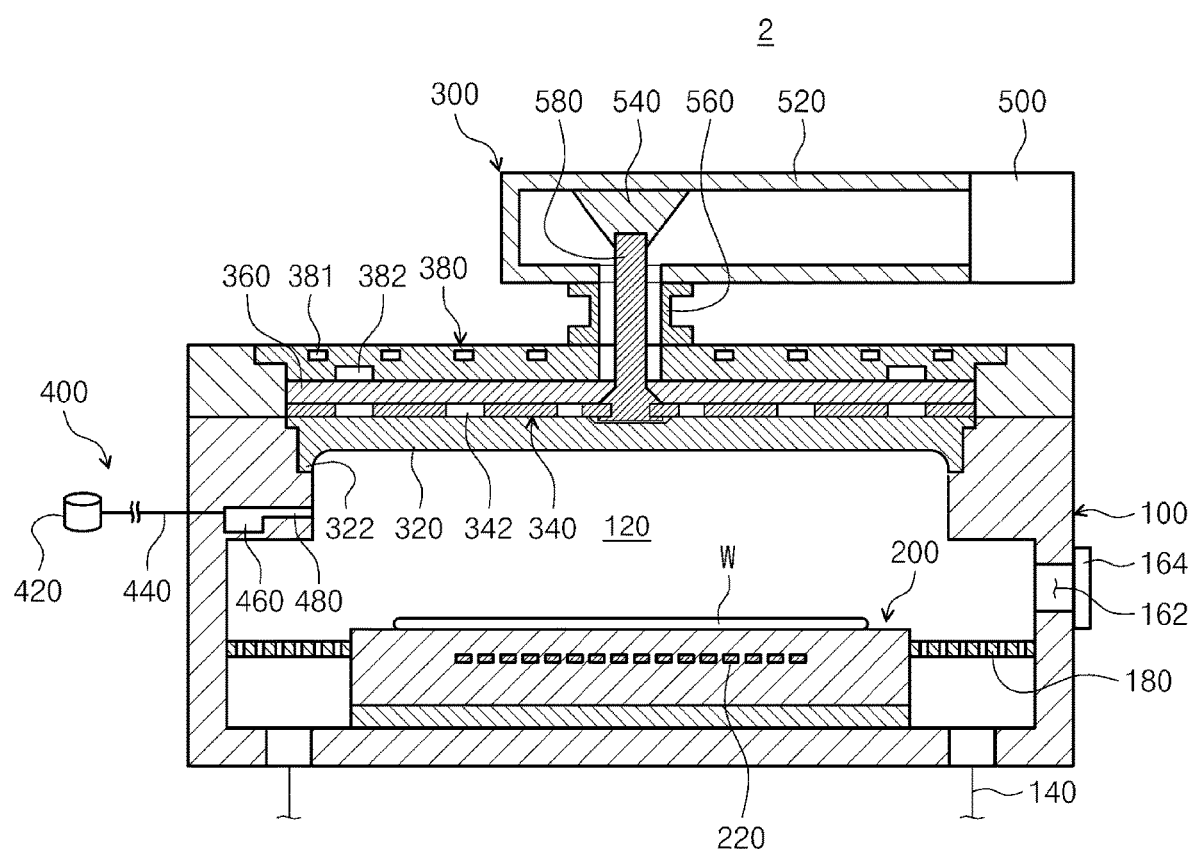
FIG. 3 is a cross-sectional view schematically illustrating a substrate processing apparatus according to an exemplary embodiment of the present invention.

FIG. 3 is a cross-sectional view schematically illustrating a substrate processing apparatus according to an exemplary embodiment of the present invention. Referring to FIG. 3, a substrate processing apparatus 2 has a process chamber 100, a support unit 140, a microwave application unit 300, and a gas supply unit 400.

The process chamber 100 has a processing space 120 therein. On a side wall of the process chamber 100, a carrying port 162 through which a substrate W is carried is formed. The carrying port 162 may be opened and closed by a door 164.

The support unit 140 may support the substrate W in the processing space 120. According to the exemplary embodiment, the support unit 140 may support the substrate W by an electrostatic force. Optionally, the support unit 140 may support the substrate W by mechanical clamping. Optionally, without a means for fixing the substrate W, the substrate W may be placed on the support unit 140.

The support unit 140 may be provided with a heating member 220 for heating the substrate W. According to the exemplary embodiment, the heating member 220 may be provided as a hot wire disposed inside the support unit 140.

The gas supply unit 400 supplies the processing gas to the processing space 120. The processing gas may include hydrogen. The gas supply unit 400 has a gas supply source 420 and a gas supply line 440. The gas supply source 420 may be coupled to the side wall of the process chamber 100 by the gas supply line 440. According to the exemplary embodiment, the side wall of the process chamber 100 is provided with a ring-shaped buffer space 460, and the gas supply line 440 supplies processing gas to the buffer space 460. The side wall of the process chamber 100 is formed with an ejection line 480 which is extended from the buffer space 460 to eject the gas to the processing space 120. A plurality of ejection lines 480 may be provided along the circumference of the process chamber 100.

An exhaust line 140 is connected to a lower wall of the process chamber 100. A pump (not illustrated) is connected to the exhaust line 140 to adjust the pressure in the processing space 120 to process pressure. A ring-shaped exhaust baffle 180 is provided on the side of the support unit 140 in the processing space 120. An inner surface of the exhaust baffle 180 is in contact with the support unit 140, and an outer surface of the exhaust baffle may be in contact with the side wall of the process chamber 100. The gas is uniformly exhausted to the lower space from the upper space of the exhaust baffle 180 by the exhaust baffle 180.

The microwave application unit 300 has a transmissive plate 320, an antenna plate 340, a dielectric plate 360, an upper plate 380, and a power supply 500.

The transmissive plate 320 is provided with a quartz material. Optionally, the transmissive plate 320 may be provided with a dielectric material such as aluminum oxide ($Al_2O_3$), aluminum nitride (AlN), sapphire, or silicon nitride (SiN). The transmissive plate 320 functions as an upper wall of the processing space 120 and transmits the microwave to the processing space 120. According to the exemplary embodiment, the upper surface of the transmissive plate 320 has a flat shape. In addition, a central region of the lower surface of the transmissive plate 320 has a flat shape, and a protrusion 322 protruding downward may be provided in an edge region of the lower surface of the transmissive plate 320. Optionally, a protrusions or a groove may be formed in the central region of the lower surface of the transmissive plate 320.

The antenna plate 340 is provided in a disk shape and is disposed on the transmissive plate 320. The antenna plate 340 is positioned to be in contact with the transmissive plate 320. Optionally, the antenna plate 340 may be positioned so as to be spaced apart from the transmissive plate 320 at a predetermined distance. The antenna plate 340 may be provided with a metal material. According to the exemplary embodiment, the antenna plate 340 may be provided with a copper or aluminum material. Gold or silver may be plated on the surface of the antenna plate 340. A plurality of slots 342 for radiating the microwave are formed in the antenna plate 340. The slots 342 are formed to penetrate from the upper surface to the lower surface of the antenna plate 340.

Figure 4:
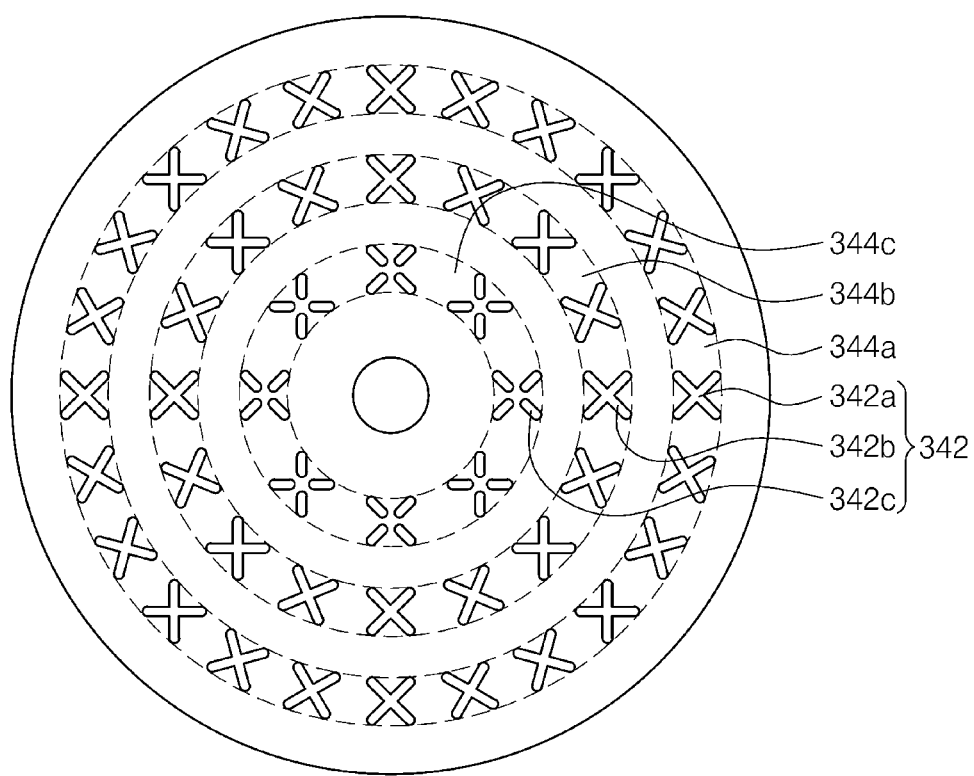
FIG. 4 is a plan view illustrating an example of slots formed in an antenna plate of FIG. 3.

FIG. 4 is a plan view illustrating an example of slots formed in the antenna plate.

Referring to FIG. 4, the slots 342 are arranged to form a plurality of rings in the antenna plate 340. The antenna plate 340 has a first region 344a, a second region 344b, and a third region 344c, which are formed with the slots 342 and have ring shapes. The first region 344a is positioned farther away from the center of the antenna plate 340 than the second region 344b. In addition, the second region 344b is positioned farther away from the center of the antenna plate 340 than the third region 344c. The first region 344a, the second region 344b, and the third region 344c are provided in a circular ring shape that covers the center of the antenna plate 340. The first region 344a, the second region 344b, and the third region 344b are concentrically provided to each other. The first region 344a is provided to cover the second region 344b, and the second region 344b is provided to cover the third region 344c. The first region 344a and the second region 344b are spaced apart from each other, and the second region 344b and the third region 344c are spaced apart from each other.

Hereinafter, the slots 342 formed in the first region 344a are referred to as first slots 342, and the slots 342 formed in the second region 344b are referred to as second slots 342, and the slots 342 formed in the third region 344c are referred to as third slots 342.

The first slots 342 are formed in the same shape as each other. According to the exemplary embodiment, the first slot 342 is provided in a '+' shape in which two long '−' shaped slits cross each other. The second slots 342 are formed in the same shape as each other. According to the exemplary embodiment, the second slot 342 is provided in a '+' shape in which two long '−' shaped slits cross each other in the same manner as the first slot 342. The third slots 342 are formed in the same shape as each other. According to the exemplary embodiment, the third slot 342 has a shape in which four short '−' shaped slits are spaced apart from each other at intervals of 90°.

The shapes of the first slots 342, the second slots 342, and the third slots 342 are not limited thereto, and may be variously changed. Further, the number of regions with the slots 342 is not limited thereto and may be variously changed.

The dielectric plate 360 is disposed on the antenna plate 340. The wavelength of the microwave is changed by the dielectric plate 360. The dielectric plate 360 is provided with a quartz material. Optionally, the dielectric plate 360 may be provided with a dielectric material such as aluminum oxide ($Al_2O_3$), aluminum nitride (AlN), sapphire, or silicon nitride (SiN). The dielectric plate 360 may be provided with the same material as the transmissive plate 320. Optionally, the dielectric plate 360 may be provided with a different material from the transmissive plate 320. The dielectric plate 360 may be provided in a disk shape. The upper surface and the lower surface of the dielectric plate 360 may be flatly provided, respectively. The dielectric plate 360 may be disposed to be in contact with the antenna plate 340. Optionally, the dielectric plate 360 may be disposed to be spaced apart from the antenna plate 340 at a predetermined distance.

An upper plate 380 is disposed on the dielectric plate 360. The upper plate 380 is provided with a metallic material. According to the exemplary embodiment, the upper plate 380 may be provided with an aluminum material. According to the exemplary embodiment, the upper plate 380 may be provided with a cooling plate for cooling the dielectric plate 360, the antenna plate 340, and the transmissive plate 320. A cooling flow channel 381 is formed in the upper plate 380, and cooling water may flow through the cooling flow channel 381.

The power supply 500 generates a microwave. The microwave generated in the power supply 500 has a frequency of 23 GHz to 26 GHz. The microwave is transmitted through a waveguide 520. The waveguide 520 may be provided in a pipe shape with a polygonal cross section. The inner surface of the waveguide 520 is provided as a conductor. For example, the inner surface of the waveguide 520 may be provided with gold or silver.

A coaxial converter 540 is disposed inside the waveguide 520. The coaxial converter 540 is located on the opposite side of the power supply 500. One end of the coaxial converter 540 is fixed to the inner surface of the waveguide 520. The coaxial converter 540 may be provided in a cone shape in which a lower cross-sectional area is smaller than an upper cross-sectional area. The microwave transmitted through the inner space of the waveguide 520 is mode-converted in the coaxial converter 540 to be propagated in a lower direction.

The mode-converted microwave is transferred to an antenna through an outer conductor 560 and an inner conductor 580. The outer conductor 560 is located between the waveguide 520 and the upper plate 380. According to the exemplary embodiment, an upper end of the outer conductor 560 is in contact with the waveguide 520, and an lower end of the outer conductor 560 is in contact with the upper plate 380. A space connected with an inner space of the waveguide 520 is formed inside the outer conductor 560. The inner conductor 580 is positioned inside the outer conductor 560. The inner conductor 580 is provided in a rod shape, and a longitudinal direction is disposed in a vertical direction. The outer surface of the inner conductor 580 is spaced apart from the inner surface of the outer conductor 560.

An upper end of the inner conductor 580 is fixed to a lower end of the coaxial converter 540. The inner conductor 580 extends in a lower direction. The lower end of the inner conductor 580 is fixedly coupled to the center of the antenna plate 340. The inner conductor 580 is disposed perpendicular to the upper surface of the antenna plate 340. The inner conductor 580 and the outer conductor 560 are coaxially provided.

The microwave propagated to the antenna plate 340 in the vertical direction is propagated along a radial direction of the dielectric plate 360, and then transmitted to the processing space 120 through the slots 342 formed in the antenna plate 340 and the transmissive plate 320.

Referring back to FIG. 4, an adjustment groove 382 is formed on the upper plate 380. The adjustment groove 382 adjusts the electric field provided to the processing space 120. The adjustment groove 382 is formed on the lower surface of the upper plate 380.

Figure 5:
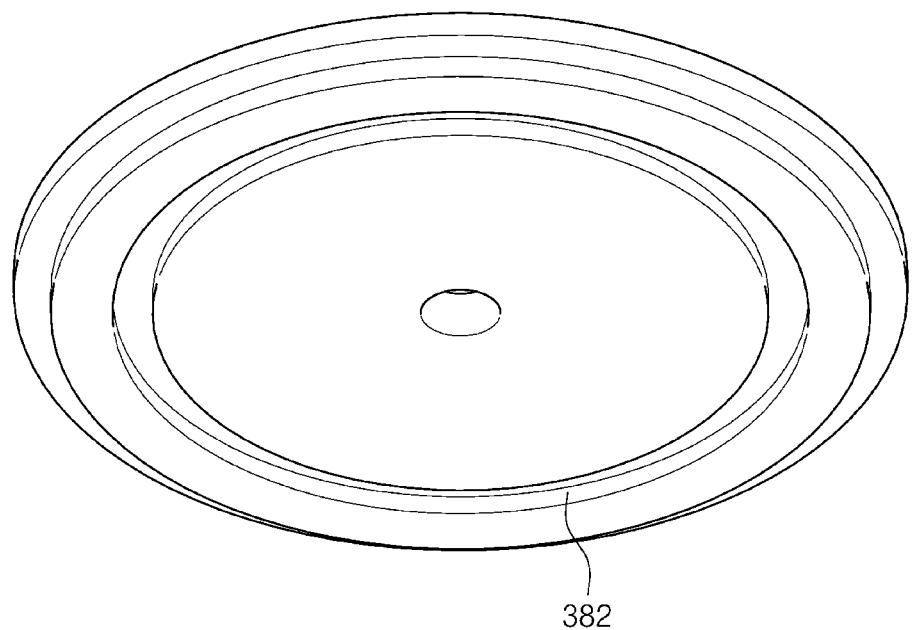
FIG. 5 is a perspective view illustrating an example of an upper plate of FIG. 3.

FIG. 5 is a perspective view illustrating an example of the upper plate of FIG. 3. Referring to FIG. 5, an adjustment groove 382 may be provided in a ring shape. The adjustment groove 382 is formed at a predetermined depth from the bottom to the top of the upper plate 380. The adjustment groove 382 may be formed in the same width along a circumferential direction thereof. In addition, the adjustment groove 382 may be formed in the same width along the circumferential direction thereof.

The microwave applied to the antenna plate 340 is propagated outwardly along a radial direction thereof. In the region where the adjustment groove 382 is provided, a part of the microwave is induced to the adjustment groove 382. As a result, when viewed from the top, an electric field is weakened in a region overlapping with the region in which the adjustment groove 382 is provided in the processing space 120.

In general, when using the substrate processing apparatus having the general structure as illustrated in FIG. 1, an electric field is concentrated in a region facing the edge region of the antenna plate in the processing space as compared with other regions. According to the exemplary embodiment of the present invention, as illustrated in FIG. 3, the adjustment groove 382 may be formed in the region facing the edge region of the antenna plate 340 of the lower surface of the upper plate 380.

Further, since the microwave propagated along the antenna plate 340 is transmitted in the lower direction through the slots 342 and the transmissive plate 320, the electric field is relatively concentrated in the region facing the region formed with the slots 342 in the processing space 120 as compared with other regions. Accordingly, according to the exemplary embodiment, the adjustment groove 382 may be formed in a region facing the region formed with the slots 342 in the lower surface of the upper plate 380.

The depth and the width of the adjustment groove 382 affect the size of the electric field and the width of the region where the electric field is adjusted. Therefore, the depth and the width of the adjustment groove 382 may be selected in consideration of the size of the electric field and the width of the region where the electric field is concentrated.

Figure 6:
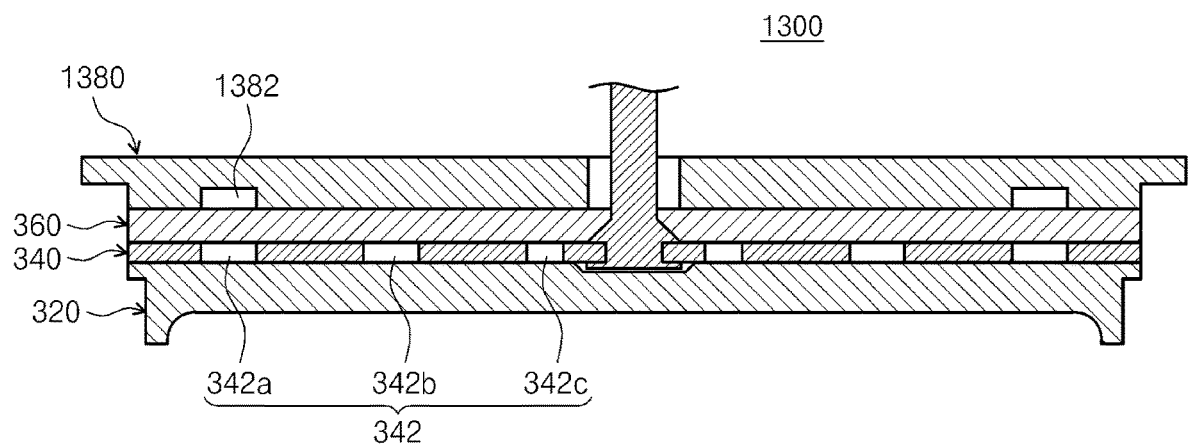
FIGS. 6 and 7 are a cross-sectional view and a plan view of a microwave application unit illustrating formation positions of adjustment grooves according to an exemplary embodiment of the present invention, respectively.
Figure 7:
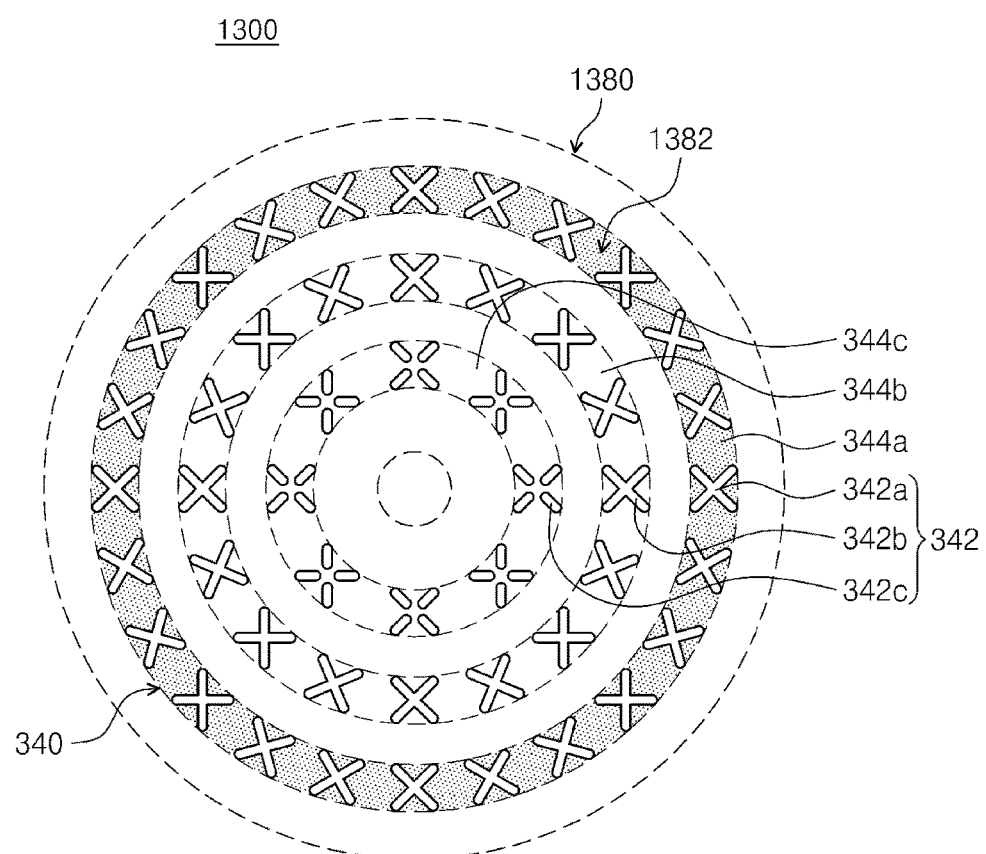

FIGS. 6 and 7 are a cross-sectional view and a plan view of a microwave application unit illustrating formation positions of adjustment grooves according to an exemplary embodiment of the present invention, respectively. In FIG. 7, a region indicated by the shade is a region where the adjustment groove is formed in the upper plate.

Referring to FIGS. 6 and 7, when the slots 342 are formed in the first region 344a, the second region 344b, and the third region 344c of the antenna plate 340, an adjustment groove 1382 is formed in a region facing the first region 344a provided on the outermost side of these regions. The width of the adjustment groove 1382 may be provided substantially the same as the width of the first region 344a. If the adjustment groove 1382 is not provided, in FIG. 6, the electric field is most concentrated in a region facing the region where the adjustment groove 1382 is provided in the processing space 12 as a region where the slots 342 are formed while corresponding to the edge region of the antenna plate 340 among regions of the processing space 120 to increase the plasma density. When the adjustment groove 1382 is provided to the region facing the region, it is possible to prevent the electric field from being concentrated in the region. As a result, the plasma uniformity may be improved in the entire region of the processing space 120. The formation position of the adjustment groove 1382 in the microwave application unit 1300 described above may be provided differently from those described above depending on the actual density of the plasma for each region in the processing space 120.

Figure 8:
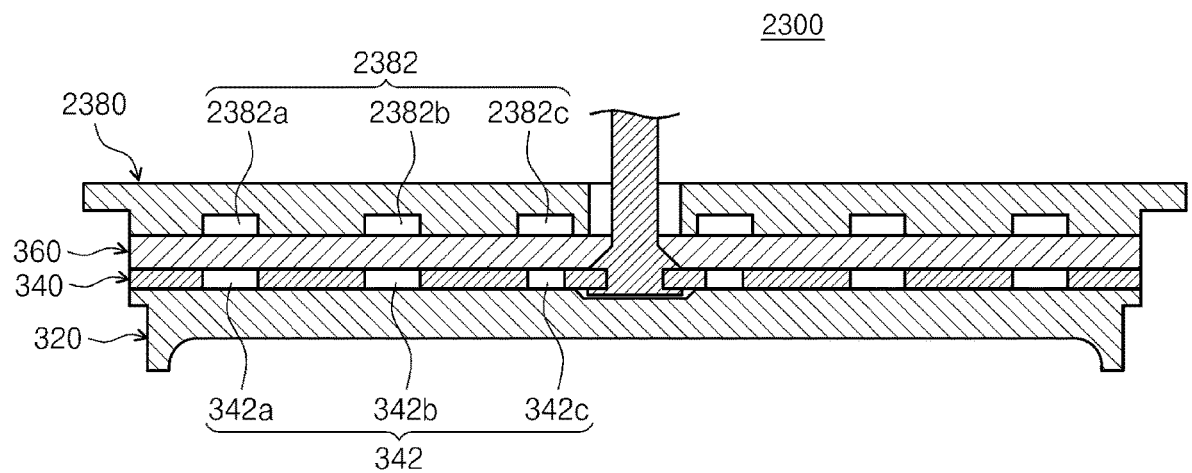
FIGS. 8 and 9 are a cross-sectional view and a plan view of a microwave application unit illustrating formation positions of adjustment grooves according to another exemplary embodiment of the present invention, respectively.
Figure 9:
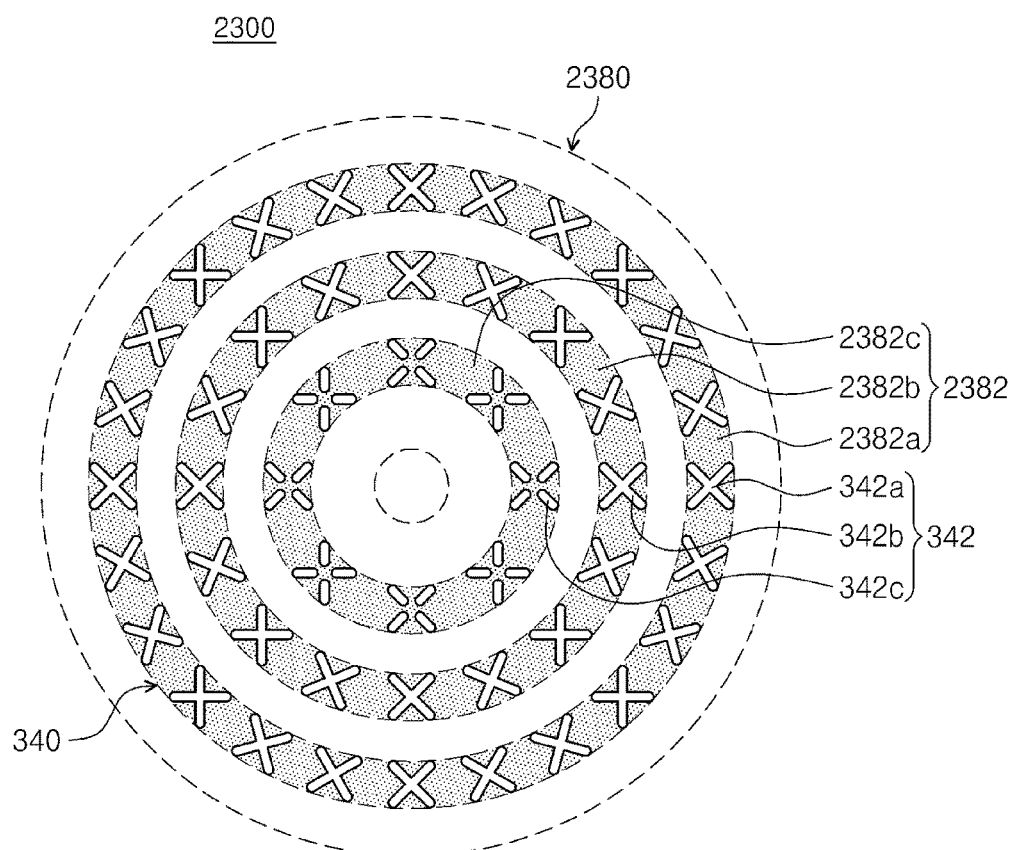

FIGS. 8 and 9 are a cross-sectional view and a plan view of a microwave application unit illustrating formation positions of adjustment grooves according to another exemplary embodiment of the present invention, respectively. In FIG. 8, a region indicated by the shade is a region where the adjustment groove is formed in the upper plate.

Referring to FIGS. 8 and 9, an adjustment groove 2382 is formed at a position corresponding to each of regions in which the slots 342 are formed. For example, the slots 342 are formed in the first region 344a, the second region 344b, and the third region 344c of the antenna plate 340, and the adjustment groove 2382 includes a first groove 2382a, a second groove 2382b, and a third groove 2382c. The first groove 2382a is formed in a region facing the first region 344a, the second groove 2382b is formed in a region facing the second region 344b, and the third groove 2382c is formed in a region facing the third region 344c. According to the exemplary embodiment, the first region 344a, the second region 344b, and the third region 344c may be all provided in the same width as each other, and the first groove 2382a, the second groove 2382b, and the third groove 2382c may be all provided with the same width as each other. Further, both the first groove 2382a, the second groove 2382b, and the third groove 2382c, and the third groove 2382c may be all provided at the same depth as each other. In the case of using a microwave application unit 2300 of FIGS. 8 and 9, it is possible to prevent the electric field from being concentrated in the entire region facing the region where the slots 342 are formed in the antenna plate 340 of the processing space 120.

Figure 10:
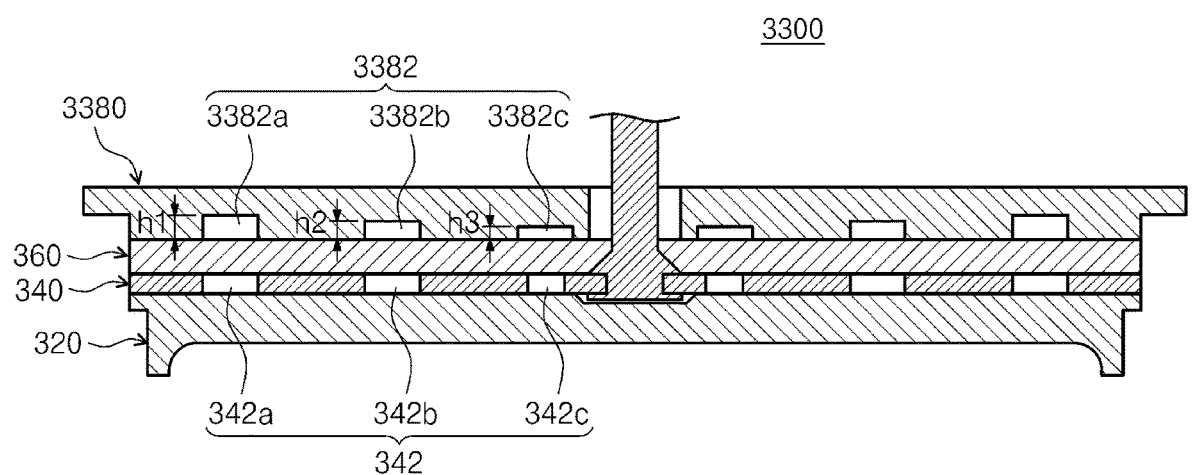
FIG. 10 is a cross-sectional view of a microwave application unit illustrating formation positions of adjustment grooves according to another exemplary embodiment of the present invention.

FIG. 10 is a cross-sectional view of a microwave application unit illustrating formation positions of adjustment grooves according to another exemplary embodiment of the present invention.

A plurality of adjustment grooves 3382 are formed on an upper plate 3380. Each adjustment groove 3382 is formed in a ring shape. The adjustment grooves 3382 are provided at different depths from each other. According to the exemplary embodiment, the farther the distance from the center of the antenna plate 340, the larger the depth of the adjustment groove 3382 may be provided. For example, as illustrated in FIG. 10, a first groove 3382a is formed on the upper plate 3380 at a position facing the first region 344a, a second groove 3382b is formed on the upper plate 3380 at a position facing the second region 344b, and a third groove 3382c is formed on the upper plate 3380 at a position facing the third region 344c. A depth h1 of the first groove 3382a may be provided larger than a depth h2 of the second groove 3382b, and the depth H2 of the second groove 3382b may be provided larger than a depth h3 of the third groove 3382c. In general, since the electric field is further gradually concentrated toward the edge region of the antenna plate 340, when using a microwave application unit 3300 in FIG. 10, the electric field may be provided in a more uniform size in the processing space 120. The size relationship in the depths between the first groove 3382a, the second groove 3382b, and the third groove 3382c may be provided differently above depending on the actual density of the plasma for each region in the process space 120.

Figure 11:
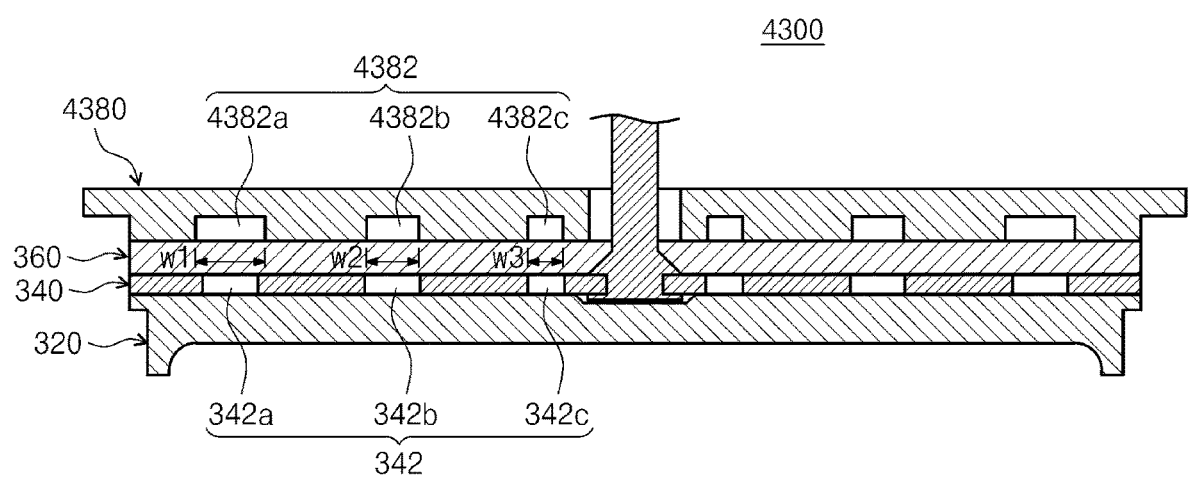
FIGS. 11 and 12 are a cross-sectional view and a plan view of a microwave application unit illustrating positions of adjustment grooves according to yet another exemplary embodiment of the present invention, respectively.
Figure 12:
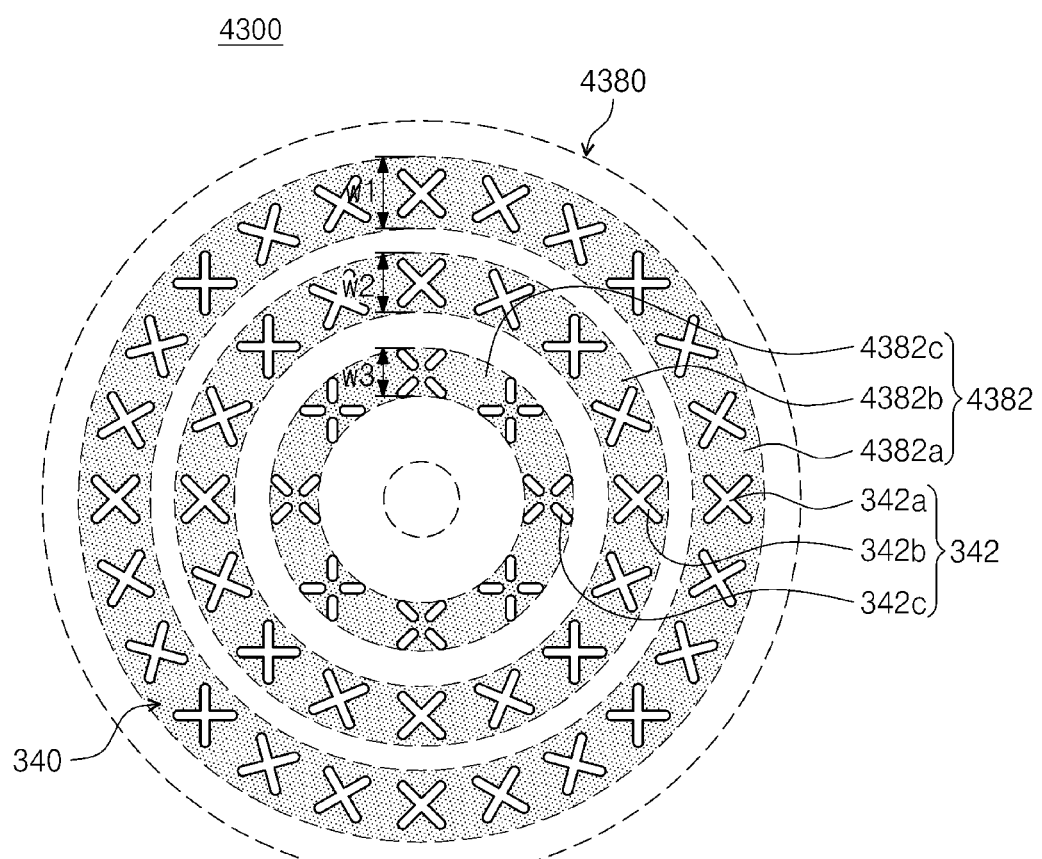

FIGS. 11 and 12 are a cross-sectional view and a plan view of a microwave application unit illustrating positions of adjustment grooves according to yet another exemplary embodiment of the present invention, respectively. In FIG. 12, a region indicated by the shade is a region where the adjustment groove is formed in the upper plate.

A plurality of adjustment grooves 4382 are formed on an upper plate 4380 in a microwave application unit 4300. Each adjustment groove 4382 is formed in a ring shape. The adjustment grooves 4382 are provided at different depths from each other. According to the exemplary embodiment, the farther the distance from the center of the antenna plate 340, the larger the width of the adjustment groove 4382 may be provided. For example, as illustrated in FIG. 10, a first groove 4382a is formed on the upper plate 4380 at a position facing the first region 344a, a second groove 4382b is formed on the upper plate 4380 at a position facing the second region 344b, and a third groove 4382c is formed on the upper plate 4380 at a position facing the third region 344c. A width W1 of the first groove 4382a may be provided larger than a width W2 of the second groove 4382b, and the width W2 of the second groove 4382b may be provided larger than a width W3 of the third groove 4382c. The size relationship in the widths between the first groove 4382a, the second groove 4382b, and the third groove 4382c may be provided differently above depending on the actual density of the plasma for each region in the process space 120.

Figure 13:
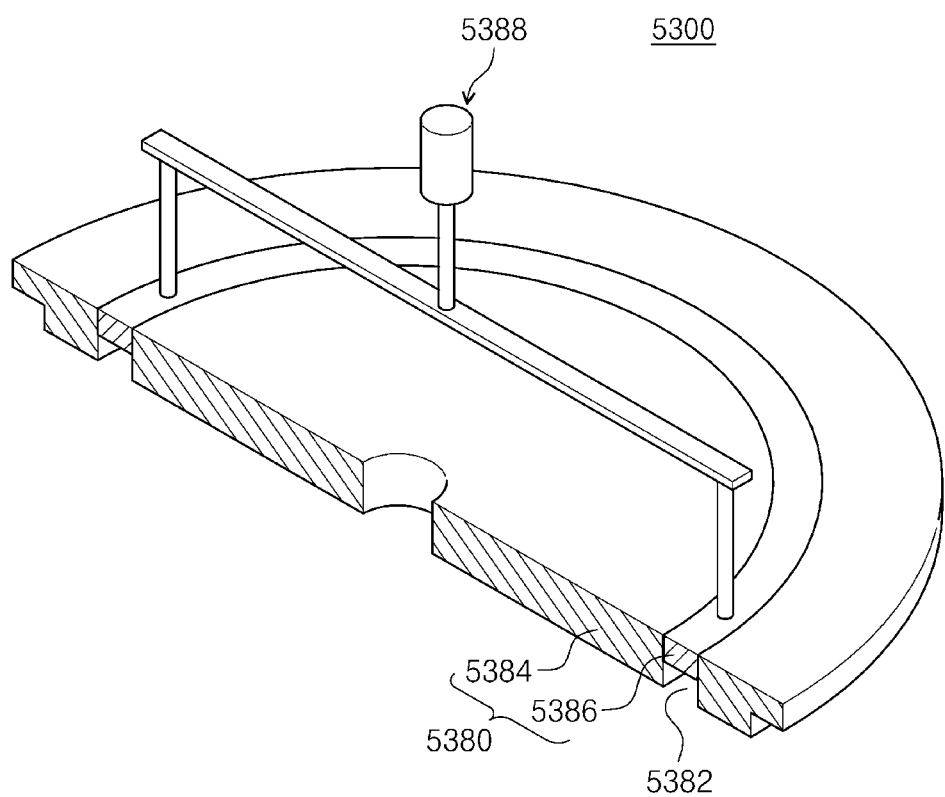
FIGS. 13 and 14 are perspective views illustrating an exemplary embodiment of an upper plate provided so that a depth of the adjustment groove is adjustable.

According to yet another exemplary embodiment of the present invention, the adjustment groove on the upper plate may be provided so that the depth thereof is adjustable. FIG. 13 is a perspective view illustrating an exemplary embodiment of an upper plate provided so that the depth of an adjustment groove is adjustable.

Figure 14:
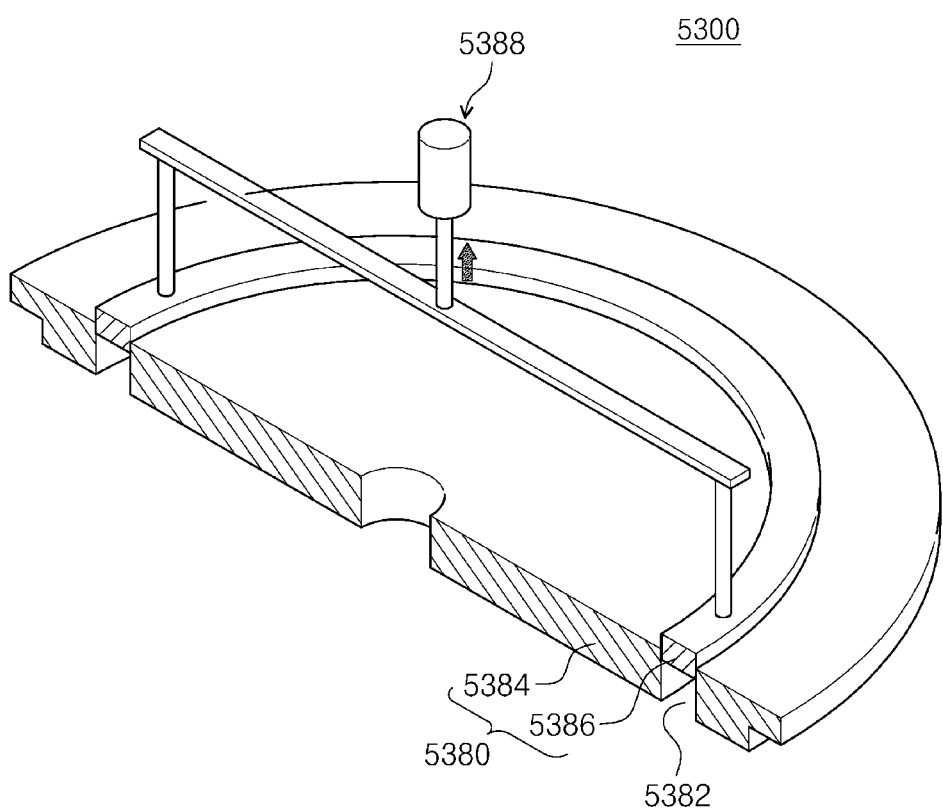

Referring to FIG. 13, an upper plate 5380 has a base plate 5384 and an adjustment plate 5386. The base plate 5384 is formed with a through hole penetrated in a vertical direction and the adjustment plate 5386 is inserted into the through hole. According to the exemplary embodiment, the through hole is formed in a ring shape, and the adjustment plate 5386 has a ring shape. In the through hole, the lower region of the adjustment plate 5386 functions as the above-described adjustment groove 5382. The adjustment plate 5386 is provided to be movable in a vertical direction. According to the exemplary embodiment, the adjustment plate 5386 is driven in the vertical direction by a driver 5388. As illustrated in FIG. 13, when the adjustment plate 5386 is fully inserted into the through hole, the depth of the adjustment groove 5382 is provided small. As illustrated in FIG. 14, when a part of the adjustment plate 5386 is moved to protrude to the top of the base plate 5384, the depth of the adjustment groove 5382 becomes larger. The driver 5388 is provided as a cylinder so that the depth of the adjustment groove 5382 may be changed between a first size and a second size. Optionally, the driver 5388 is provided as a motor so that the depth of the adjustment groove 5382 may be changed in various sizes.

Figure 15:
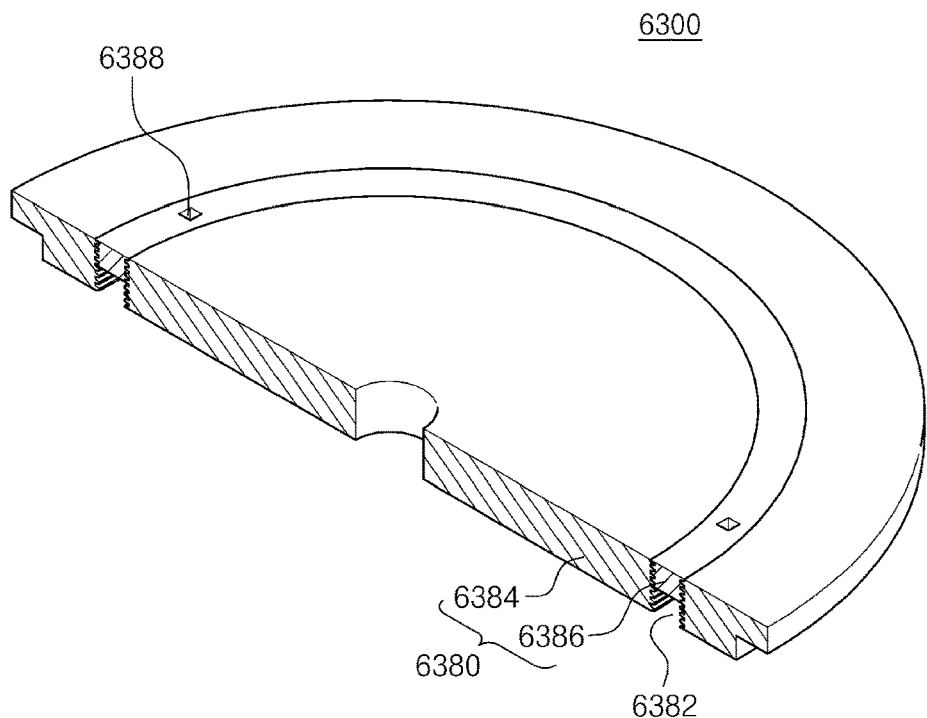
FIGS. 15 and 16 are perspective views illustrating an exemplary embodiment of the upper plate provided so that the depth of the adjustment groove is adjustable.
Figure 16:
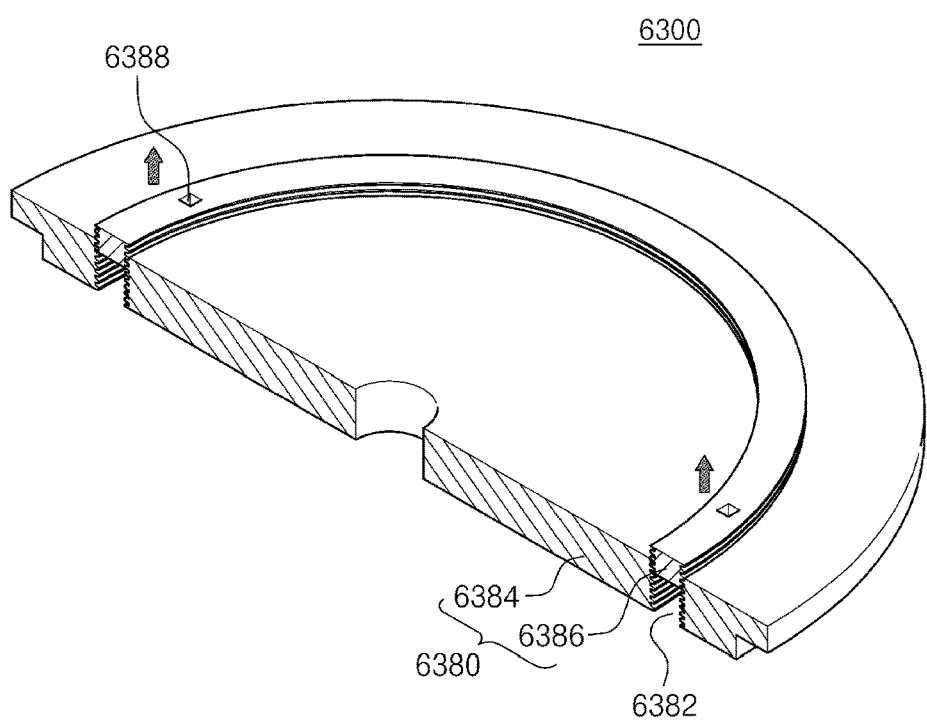

Optionally, the depth adjustment of an adjustment groove 6382 may be made manually by an operator. Threads may be formed on the inner surface of the through hole of the base plate 6384 and the outer surface of the adjustment plate 6386, respectively. A tool groove 6388 to which a tool is inserted may be formed on the upper surface of the adjustment plate 6386 to rotate the adjustment plate 6386. As illustrated in FIG. 15, when the adjustment plate 6386 is fully inserted into the through hole, the depth of the adjustment groove 6382 is provided small. As illustrated in FIG. 16, when a part of the adjustment plate 6386 is moved to protrude to the top of the base plate 6384 by the rotation of the adjustment plate 6386, the depth of the adjustment groove 6382 is provided large.

Figure 17:
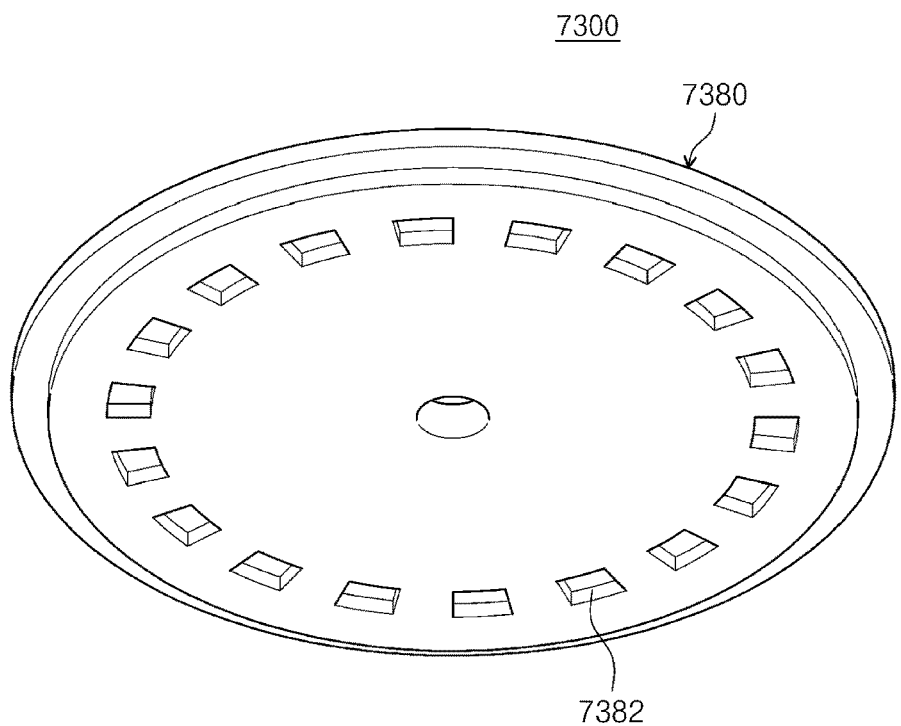
FIGS. 17 and 18 are diagrams illustrating other modifications of the upper plate, respectively.

In the above exemplary embodiment, the case where the adjustment groove is formed in a ring shape has been described as an example. However, unlike this, as illustrated in FIG. 17, an upper plate 7380 is provided with a plurality of adjustment grooves 7382 at the same distance from the center of the antenna plate 340, and these adjustment grooves 7382 may be arranged to form a ring.

Figure 18:
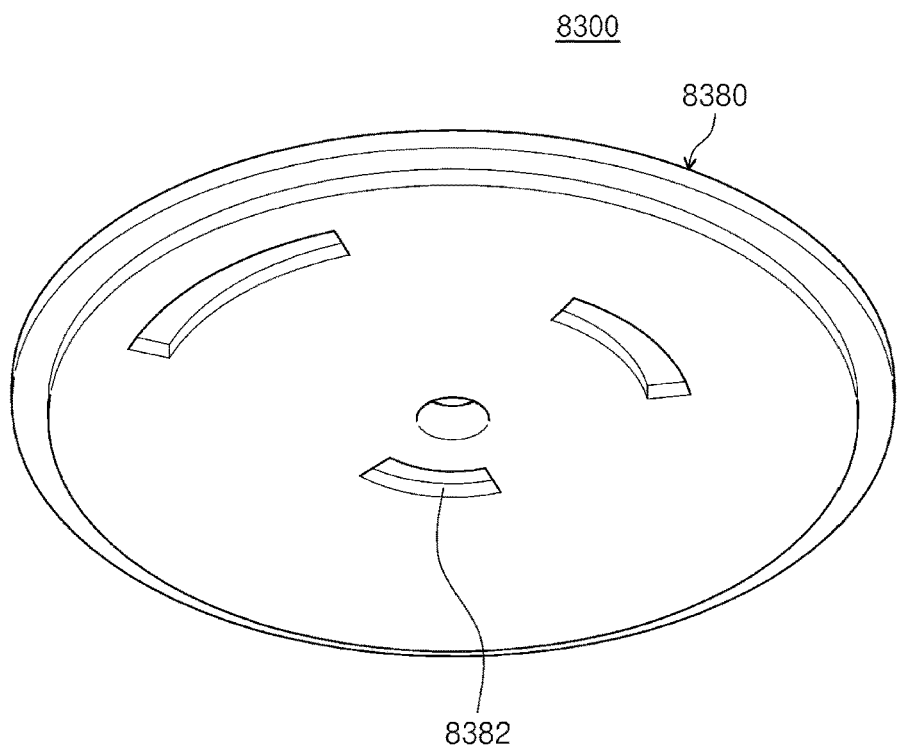

In the above exemplary embodiment, it has been described as an example that the adjustment grooves are arranged based on the distance from the center of the antenna plate. However, unlike this, when the region where the electric field is concentrated in the processing space 120 is a specific region regardless of the distance, in an upper plate 8380, as illustrated in FIG. 18, an adjustment groove 8382 may be formed only in a region facing the above specific region.

In the above exemplary embodiment, it has been described that the adjustment grooves are formed in the region facing the slots formed in the antenna plate. However, unlike this, the adjustment grooves may be formed in a region that is not overlapped with the slots formed on the antenna plate when viewed from the top.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate comprising: a process chamber configured to have a processing space therein; a support configured to support the substrate in the process chamber; a gas supply configured to supply processing gas to the processing space; and a microwave application unit configured to generate plasma from the processing gas supplied to the processing space, wherein the microwave application unit includes: a transmissive plate configured to transmit a microwave to the processing space; an antenna plate disposed on the support unit transmissive plate and having a plurality of slots; a power supply configured to apply the microwave to the antenna plate; a dielectric plate disposed above the antenna plate to face the antenna plate; and an upper plate disposed above the dielectric plate, wherein an adjustment groove is formed on a lower surface of the upper plate and configured to adjust an electric field, wherein the adjustment groove is configured to affect the size and width of the electric field by adjusting a depth and width of the adjustment groove.

2. The apparatus for treating the substrate of claim 1, wherein the adjustment groove is provided in a region facing the plurality of slots formed in the antenna plate.

3. The apparatus for treating the substrate of claim 1, wherein the adjustment groove is provided in a ring shape surrounding a center of the antenna plate when viewed from the top.

4. The apparatus for treating the substrate of claim 1, wherein the adjustment groove is provided in a region facing an edge region of the antenna plate.

5. The apparatus for treating the substrate of claim 1, wherein the plurality of slots are arranged to form one ring or a plurality of rings surrounding the center of the antenna plate, and
wherein the adjustment groove is provided in regions overlapping with the plurality of slots when viewed from the top, respectively.

6. The apparatus for treating the substrate of claim 1, wherein the plurality of slots are arranged to form one ring or a plurality of rings to surround the center of the antenna plate, and
wherein the adjustment groove is provided so that depths thereof are different from each other according to a distance from the center of the antenna plate.

7. The apparatus for treating the substrate of claim 6, wherein the adjustment grooves are provided so that the depths thereof are increased as being far away from the center of the antenna plate.

8. The apparatus for treating the substrate of claim 1, wherein the upper plate includes
a base plate having a through hole; and
an adjustment plate disposed in the through hole and provided to be movable in a vertical direction to the base plate,
wherein a lower region of the adjustment plate among the through hole is provided as the adjustment groove, and
wherein the depth of the adjustment groove is provided to be changeable along the movement in the vertical direction of the adjustment plate.

9. The apparatus for treating the substrate of claim 8, wherein the upper plate further includes a driver configured to drive the adjustment plate in a vertical direction.

10. The apparatus for treating the substrate of claim 8, wherein the adjustment plate is screwed with the base plate.

11. The apparatus for treating the substrate of claim 1, wherein the upper plate and the dielectric plate are disposed in contact with each other.

12. An apparatus for treating a substrate comprising:
a process chamber configured to have a processing space therein;
a support configured to support the substrate in the process chamber;
an antenna plate disposed above the support unit and having a plurality of slots penetrated in a vertical direction;
a power supply configured to apply a microwave to the antenna plate;

a dielectric plate disposed above the antenna plate to face the antenna plate;

an upper plate disposed above the dielectric plate and including a cooling flow channel to cool the dielectric plate;

a transmissive plate provided below the antenna plate and configured to transmit the microwave to the processing space; and a gas supply configured to supply processing gas to the processing space, wherein a ring-shaped adjustment groove is formed on a lower surface of the upper and configured to adjust an electric field.

13. The apparatus for treating the substrate of claim 12, wherein the antenna plate includes a first region and a second region which are provided with the plurality of slots, respectively, and have ring shapes which are concentric with the center of the antenna plate, wherein the first region is a region which is farther away from the center of the antenna plate than the second region, and wherein the ring-shaped adjustment groove includes a first groove provided in a region facing the first region.

14. The apparatus for treating the substrate of claim 13, wherein the ring-shaped adjustment groove further includes a second groove provided in a region facing the second region.

15. The apparatus for treating the substrate of claim 14, wherein a depth of the first groove is provided larger than a depth of the second groove.

16. The apparatus for treating the substrate of claim 12, wherein the adjustment groove is provided in a region facing the plurality of slots.

17. The apparatus for the substrate of claim 12, wherein the upper plate includes a base plate provided with a through hole; and an adjustment plate disposed in the through hole and provided to be movable in a vertical direction to the base plate, wherein the depth of the adjustment groove is provided to be changeable along the movement in the vertical direction of the adjustment plate.

* * * * *